United States Patent [19]
Mashimoto et al.

[11] Patent Number: 5,880,530
[45] Date of Patent: *Mar. 9, 1999

[54] MULTIREGION SOLDER INTERCONNECTION STRUCTURE

[75] Inventors: Yohko Mashimoto; Shuji Inoue; Jiro Kubota; Mashahiro Kuroda, all of Ibaraki, Japan

[73] Assignee: Intel Corporation, Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 625,797

[22] Filed: Mar. 29, 1996

[51] Int. Cl.$^6$ .......................... H01L 23/48; H01L 23/52; H01L 23/29

[52] U.S. Cl. .......................... 257/783; 257/778; 257/789; 257/790

[58] Field of Search .................. 257/789, 90, 795, 257/783, 778

[56] References Cited

U.S. PATENT DOCUMENTS

| | | | |
|---|---|---|---|
| 4,970,575 | 11/1990 | Soga et al. ............................. | 257/786 |
| 4,999,699 | 3/1991 | Christie et al. ......................... | 357/65 |
| 5,089,440 | 2/1992 | Christie et al. ......................... | 437/209 |
| 5,121,190 | 6/1992 | Hsiao et al. ............................ | 357/80 |
| 5,143,785 | 9/1992 | Pujol et al. ............................. | 428/352 |
| 5,194,930 | 3/1993 | Papathomas et al. .................. | 257/773 |
| 5,250,848 | 10/1993 | Christie et al. ......................... | 257/778 |
| 5,292,688 | 3/1994 | Hsiao et al. ............................ | 437/209 |
| 5,300,459 | 4/1994 | Ushikubo et al. ...................... | 437/211 |
| 5,442,240 | 8/1995 | Mukerji .................................. | 257/783 |
| 5,468,790 | 11/1995 | Papathomas ........................... | 524/100 |
| 5,471,096 | 11/1995 | Papathomas et al. .................. | 257/778 |
| 5,550,408 | 8/1996 | Kunitomo et al. ..................... | 257/737 |
| 5,567,654 | 10/1996 | Beilstein, Jr. et al. ................. | 437/209 |

FOREIGN PATENT DOCUMENTS

| | | |
|---|---|---|
| 3-231435 | 10/1991 | Japan . |
| 5-315578 | 11/1993 | Japan . |
| 7-66326 | 3/1995 | Japan . |

*Primary Examiner*—Teresa M. Arroyo
*Attorney, Agent, or Firm*—Blakely, Sokoloff, Taylor & Zafman LLP

[57] ABSTRACT

An apparatus and method for forming solder interconnection structures that reduce thermo-mechanical stresses at the solder joints of a semiconductor device and its supporting substrate. In one embodiment, the solder interconnection structure of the present invention comprises a semiconductor device and a substrate having a plurality of solder connections extending from the substrate to electrodes or bond pads on the semiconductor device. A multilayer structure is disposed between the semiconductor device and substrate filling the gap formed by the solder connections. The multilayer structure includes a first layer and a second layer, each having a different coefficient of thermal expansion. Thus, in accordance with the present invention, the stress concentration points are moved away from the solder joints of the semiconductor device and substrate to a point located between the first and second layers of the filler structure.

14 Claims, 8 Drawing Sheets

MULTIREGION SOLDER INTERCONNECTION STRUCTURE

FIELD OF THE INVENTION

The invention relates to interconnection structures for joining an integrated semiconductor device to an organic substrate and, more particularly, to a structure for reducing thermal and mechanical stresses at the solder joints connecting the semiconductor device and substrate.

BACKGROUND OF THE INVENTION

Controlled collapse chip connection (C4) or flip-chip technology is used for interconnecting high input/output semiconductor devices to substrates via an array of solder bumps. The solder bumps typically comprise a Pb/Sn alloy and are connected to the semiconductor device and substrate at solder joinable contact pads. In many instances, the semiconductor devices are connected to substrates made of materials with coefficients of thermal expansion that differ from the coefficient of thermal expansion of the material of the semiconductor device. Normally the semiconductor device is formed of monocrystalline silicon with a coefficient of thermal expansion of $2.5–3.5 \times 10^{-6}$ per °C. The organic substrate is usually formed of polymer impregnated fiberglass having a coefficient of thermal expansion of $30–40 \times 10^{-6}$ per °C. In operation, the active and passive elements of the semiconductor device generate heat resulting in temperature fluctuations in both the semiconductor device and the supporting substrate since the heat is conducted through the solder bonds. The semiconductor device and substrate thus expand and contract in different amounts with temperature fluctuations due to the different coefficients of thermal expansion. This imposes both shear and bending stresses along the solder terminals/pads.

The stress on the solder bonds during operation is directly proportional to (1) the magnitude of the temperature fluctuations, (2) the difference in the coefficients in expansion of the material of the semiconductor device and the substrate and (3) the distance of an individual bond from the neutral or central point of the device. In addition, solder bond stresses are inversely proportional to the height of the solder bond, that is the spacing between the semiconductor device and the substrate. The problems associated with stresses at the solder/bond pad interfaces are further compounded by the fact that as solder terminals become smaller in diameter in order to accommodate the need for greater density, the overall height decreases. Due to the flexible nature of organic substrates, including those that are fiber reinforced, the substrates tend to warp or bend during processing and temperature fluctuations. This greatly magnifies the problems associated with the destructive stress forces that are placed upon a solder joint between a substrate and a semiconductor device.

Figure 1A:
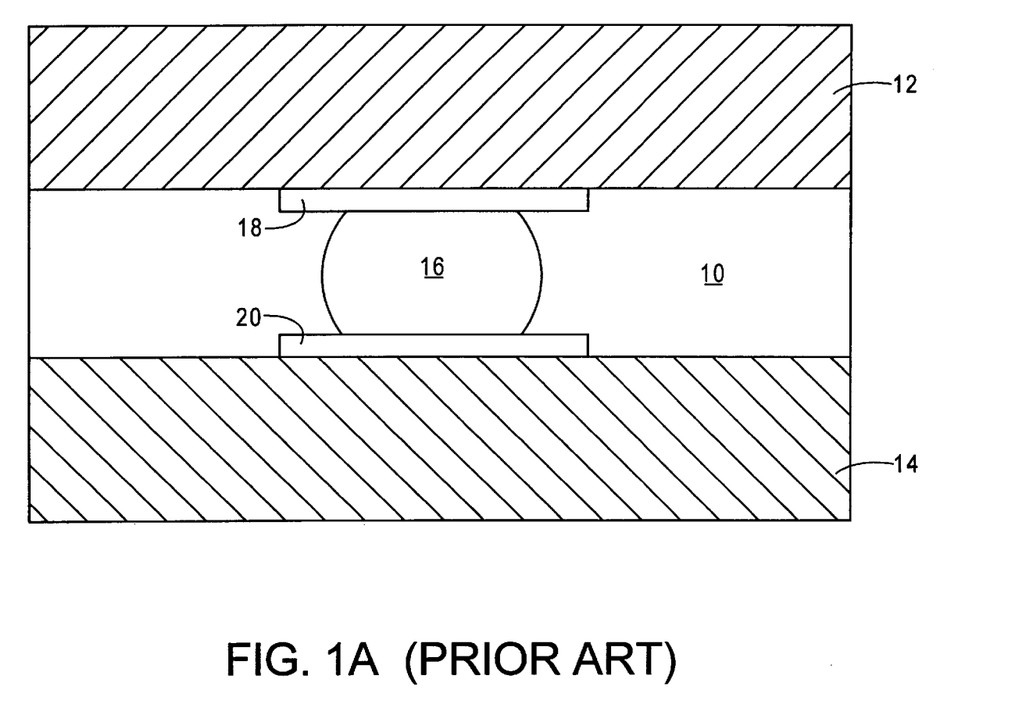
Figure 1A illustrates a prior art solder interconnection structure.

FIG. 1A illustrates a typical prior art solder interconnecting structure 10 between a semiconductor device 12 and substrate 14. Device 12 and substrate 14 are electrically coupled by C4 type solder connections 16 that are joined to solder wettable pads 18 on the semiconductor device and to corresponding solder wettable pads 20 on the substrate. The interconnection structure 10 generally comprises a single-layer, epoxy base material commonly known as a "filler".

Figure 1B:
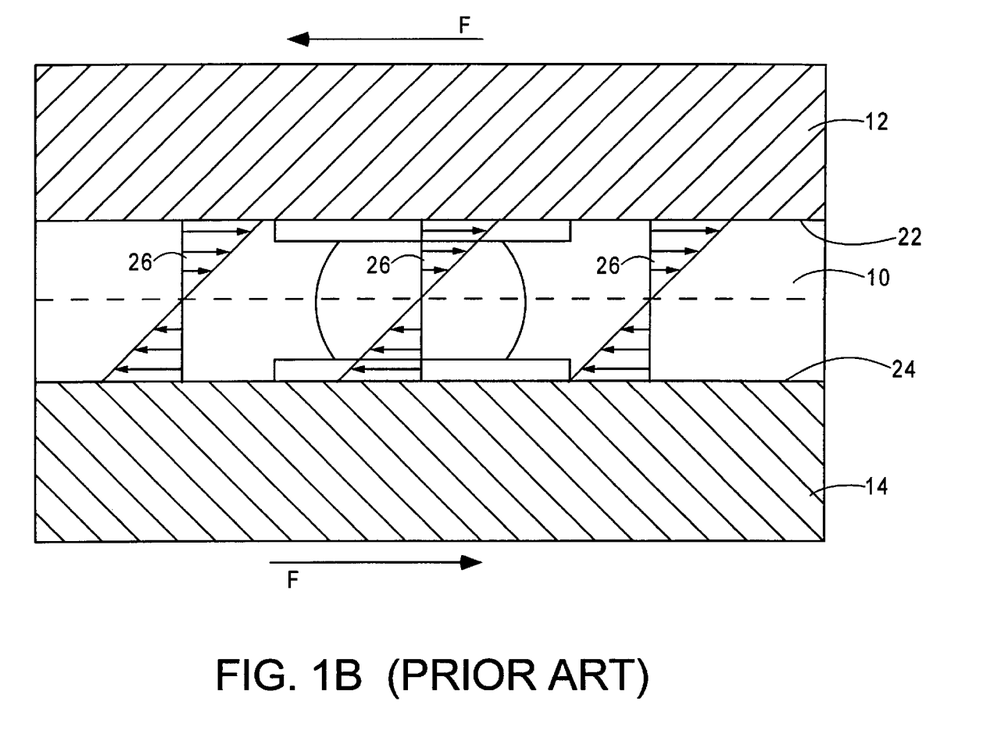
Figure 1B illustrates a typical stress distribution generated by a pure shear force acting upon the apparatus of FIG. 1A.
Figure 1C:
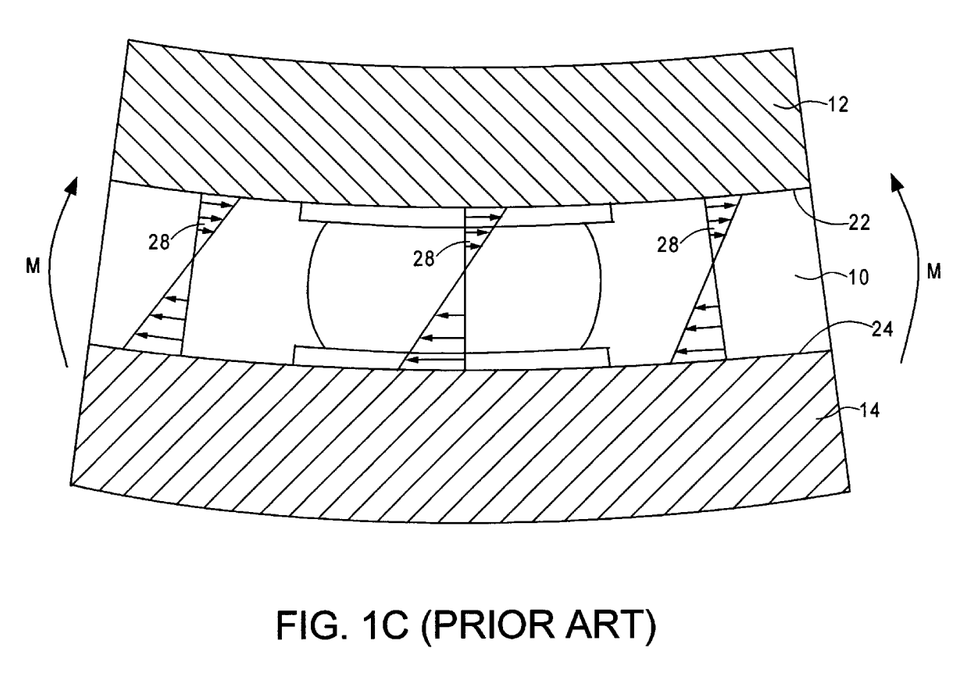
Figure 1C illustrates a typical stress distribution generated by a moment force acting upon the apparatus of FIG. 1A.

As mentioned earlier, in prior art solder interconnection structures there are many problems associated with the formation of shear and bending stresses at the solder/bond pad interfaces. These stresses are generally attributable to the difference in the coefficients of thermal expansion of the semiconductor and substrate materials. FIG. 1B illustrates a typical stress distribution 26 generated by shear forces (F) acting upon the apparatus of FIG. 1A due to the thermal expansion of substrate 14 relative to semiconductor device 12. FIG. 1C illustrates a typical bending stress distribution 28 generated by moment forces (M) acting on the apparatus of FIG. 1A due to the thermal expansion of substrate 14 relative to semiconductor device 12. As shown, the maximum shear and bending stresses acting upon the structure are concentrated at or near the facing surfaces 22 and 24 of semiconductor device 12 and substrate 14. More importantly, it is important to note that the stresses tend to concentrate along the interfaces between solder connection 16 and bond pads 18 and 20. This is especially problematic since the adhesion forces within the interconnect structure 10 are typically at a minimum along the solder connection and bond pad interfaces. The thermo-mechanical stress conditions found at the solder and bond pad interfaces will often cause cracks to form along the interfaces which eventually promulgate into the solder connections 16. As a result, the quality and reliability of the electrical connection between device 12 and substrate 14 is greatly reduced. This can often cause a device to fail resulting in lower manufacturing yields which can be very costly. Moreover, such thermo-mechanical stresses reduce the life and stability of the solder bond joints.

What is needed then is a solder interconnection structure which solves the aforementioned problems associated with concentrated stresses at the solder bond joints of semiconductor devices and their supporting substrates. As will be seen, the present invention provides a solder interconnection structure that reduces the stress concentrations at the solder connection and bond pad interfaces and, thus enhances the reliability of the electrical connection between a semiconductor device and supporting substrate.

SUMMARY OF THE INVENTION

The present invention is directed at providing an apparatus and method for forming solder interconnection structures that reduce stresses at the solder joints of a semiconductor device at its supporting substrate.

In one embodiment, the solder interconnection structure of the present invention comprises a semiconductor device and a substrate having a plurality of solder connections extending from the substrate to electrodes or bond pads on the semiconductor device. A multiregion structure is disposed between the semiconductor device and substrate filling the gap formed by the solder connections. The multiregion structure includes a plurality of filler regions wherein each adjoining layer possesses a different coefficient of thermal expansion.

The present invention also includes a method for forming a multiregion interconnection structure between a semiconductor device and substrate that are connected by a plurality of solder connections. The method includes attaching a semiconductor device to a substrate by a plurality of solder connections that extend from the substrate to electrodes or solder pads on the semiconductor device. The gap formed by the solder connections is then filled with a filler comprising a first material containing suspended particles of a second material having a coefficient of thermal expansion that is different than the coefficient of thermal expansion of the first material. The filler is then heated for a period of time such that a substantial portion, or all, of said particles subside in a lower region of the filler.

BRIEF DESCRIPTION OF THE DRAWINGS

The present invention is illustrated by way of example and is not limited by the figures of the accompanying drawings, in which like references indicate similar elements, and in which.

DETAILED DESCRIPTION

An apparatus and method for forming solder interconnection structures that reduce stresses at the solder joints of a semiconductor device and its supporting substrate is described. In the following description, numerous specific details are set forth such as material types, dimensions, processing steps, etc., in order to provide a thorough understanding of the present invention. However, it will be obvious to one of skill in the art that the invention may be practiced without these specific details. In other instances, well known elements and processing techniques have not been shown in particular detail in order to avoid unnecessarily obscuring the present invention.

Figure 2A:
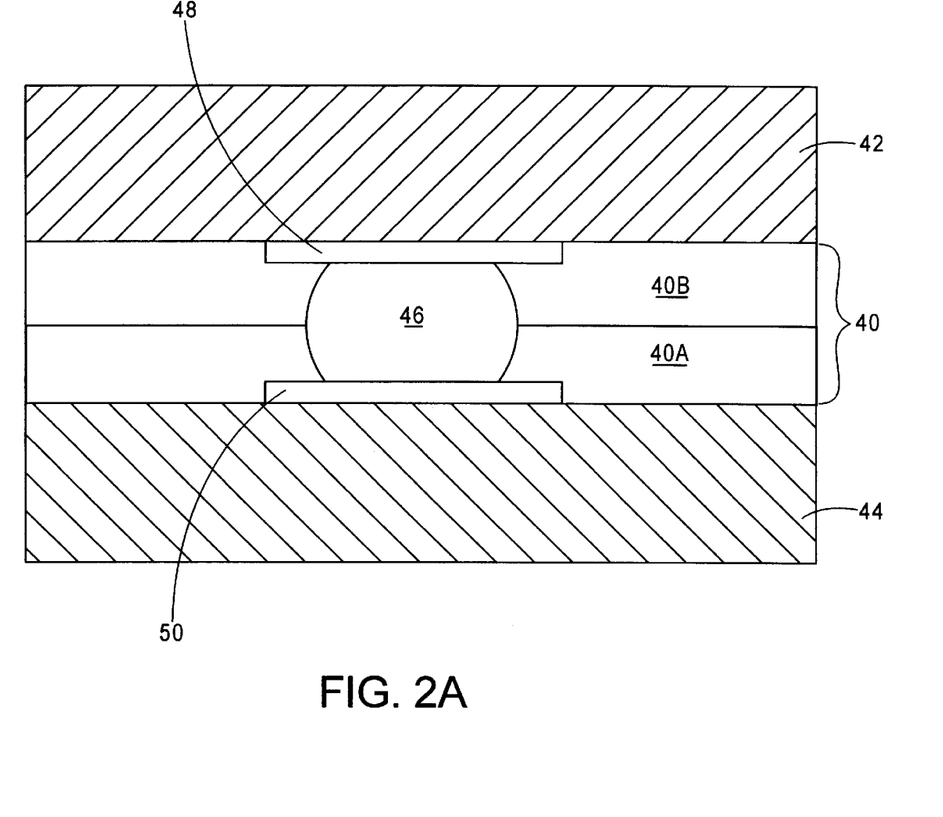
FIG. 2A illustrates a solder interconnection structure in one embodiment of the present invention.

FIG. 2A shows a cross-sectional view of a solder interconnection structure 40 of one embodiment of the present invention. Note that a single solder connection is depicted in FIG. 2A in order to clearly illustrate the features and benefits of the present invention. It is appreciated, however, that the present invention is aimed at applications employing a multitude of solder connections. The present invention is particularly applicable to interconnection structures employing C4 or flip-chip technology to connect semiconductor devices to organic substrates.

As shown in FIG. 2A, a semiconductor device 42 is joined to a substrate 44 by a solder connection 46 at pads 48 and 50. Semiconductor device 42 is typically formed of monocrystalline silicon with a coefficient of thermal expansion in the range of approximately $2.5$–$3.5 \times 10^{-6}$ per °C. Substrate 44 generally comprises an organic material with a coefficient of thermal expansion in the range of approximately $30$–$40 \times 10^{-6}$ per °C. As noted earlier, the semiconductor device and substrate expand and contract in different amounts with temperature fluctuations due to the different coefficients of thermal expansion. Since the coefficients of thermal expansion vary greatly between silicon semiconductor devices and organic substrates, large shear and bending stresses are produced during temperature fluctuations. In prior art single-layer interconnection structures these stresses concentrate at or near the solder bond joints/pads causing cracks to form at the solder bond joint and within the solder bond connection itself. The present invention addresses the problem associated with concentrated stresses at the solder bond joints by providing a multiregion interconnection structure.

Figure 2B:
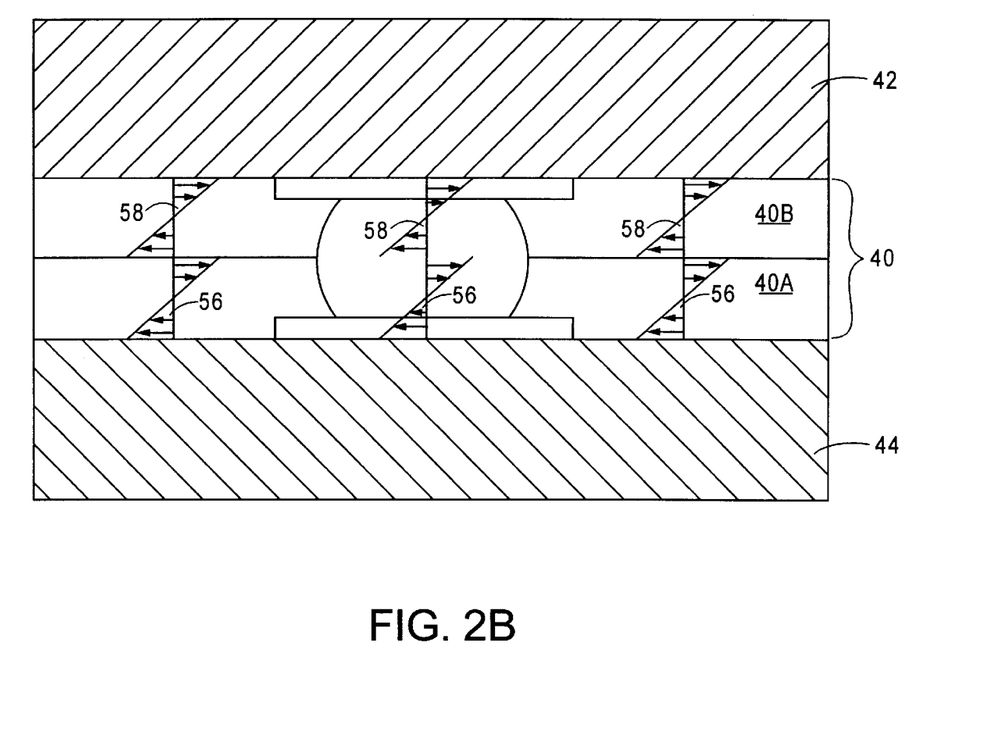
FIG. 2B illustrates the stress distribution generated by a pure shear force acting upon the apparatus of FIG. 2A.
Figure 2C:
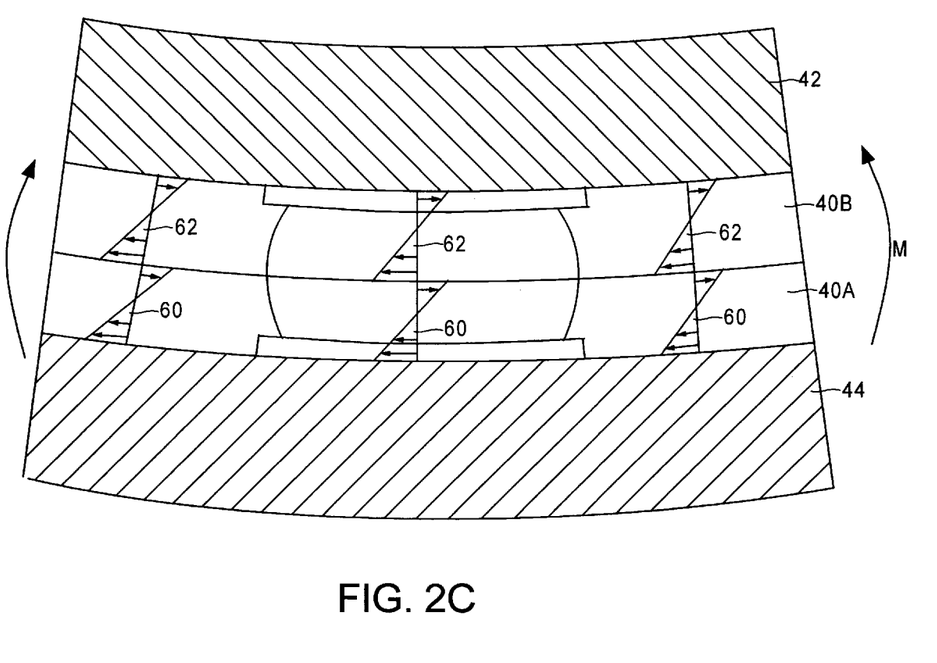
FIG. 2C illustrates the stress distribution generated by a moment force acting upon the apparatus of FIG. 2A.

As shown in FIG. 2A, in one embodiment interconnection structure 40 is divided into two regions 40A and 40B. In accordance with the present invention, regions 40A and 40B of structure 40 each possess a different coefficient of thermal expansion. In one embodiment, region 40B has a coefficient of thermal expansion that is greater than the coefficient of thermal expansion of region 40A. By providing a multiregion solder interconnection structure wherein each adjoining region possesses a different coefficient of thermal expansion, the present invention reduces the stresses at the semiconductor device and substrate solder connection joints. Stress reduction at the solder joints is accomplished by controlling the location of the stress concentration points within the structure. As shown in FIGS. 2B and 2C, by introducing an interconnection structure that is divided into two regions having different coefficients of thermal expansion, the stress concentration points are moved away from the solder bond joints. As a result, the shear and bending stresses near the solder connection interfaces are reduced as illustrated by stress distribution diagrams 56, 58, 60 and 62.

Figure 2D:
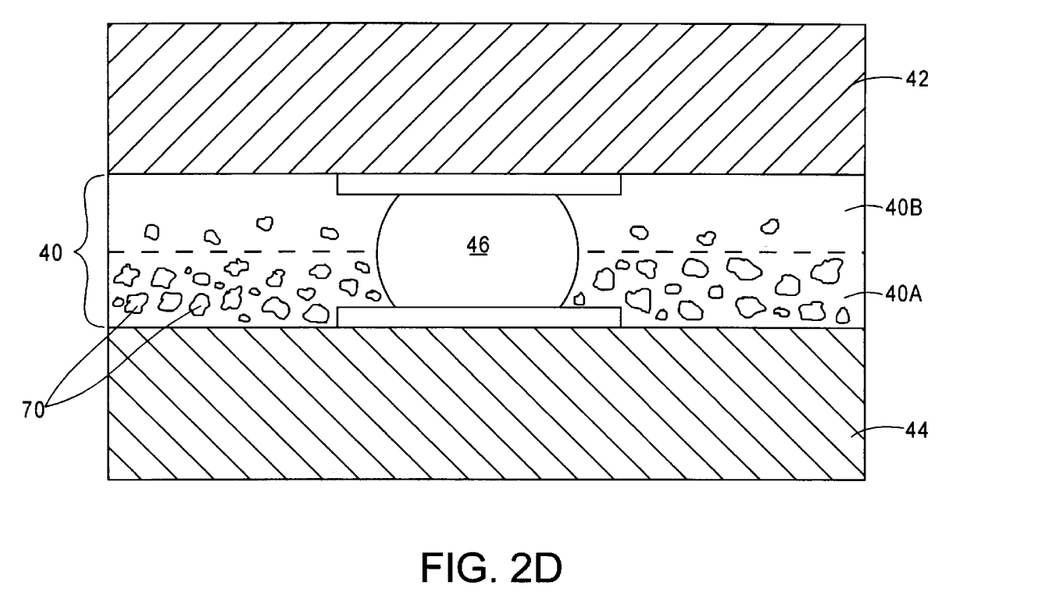
FIG. 2D shows the suspended particles in the solder interconnection of FIG. 2A.

The composition of regions 40A and 40B may vary depending upon the particular application. In most instances, however, it is desirable to maximize the difference in the coefficients of thermal expansion between the two regions in order to maximize the stress reduction at the semiconductor device and substrate solder connection joints. As an example, the filler material employed pursuant to the present invention may include an epoxy base filler that contains particles of a material having a coefficient of thermal expansion that is different than that of the epoxy base material. In one embodiment, the filler comprises an epoxy-silica composition, Type X-43-5230-3, manufactured by Shinetsu. The filler contains silica particles in the range of about 60–70% by weight. The epoxy base material possesses a coefficient of thermal expansion of approximately $65 \times 10^{-6}$ per °C. whereas the silica particles have a coefficient of thermal expansion of about $3.0 \times 10^{-6}$ per °C. Layers 40A and 40B of interconnection structure 40 are formed by dispensing a liquid epoxy filler containing silica particles into the gap between device 42 and substrate 44. The filler may be dispensed through a nozzle, syringe, or other device under pressure of about 15–50 p.s.i. and a temperature of about 90° C. Disperse and flow conditions are preferably selected such that the filler completely fills the gap between the device 42 and substrate 44. Fillers containing relatively small particle sizes are necessary so that the composite epoxy material will readily flow in the gap between semiconductor device 42 and substrate 44 to fully encapsulate solder connections 46. After the gap is filled with the epoxy-silica filler, the composition is precured at a temperature of approximately 120° C. for about one minute. During the curing process a force, such as gravity, acts upon the filler composition causing the silica particles to subside to form regions 40A and 40B. As illustrated in FIG. 2D, once the precuring process is complete, nearly all of the silica particles 70 reside within the lower region 40A of structure 40. A small percentage of silica particles may reside in regions 40B. In one embodiment, region 40A contains silica in the range of approximately 50% to 60% by weight and region 40B contains silica in the range of approximately 5% to 10% by weight, respectively. The cured compositions of regions 40A and 40B have coefficients of thermal expansion of about $25 \times 10^{-6}$ per °C. and $60 \times 10^{-6}$ per C., respectively. It is appreciated that the composition of regions 40A and 40B may be varied in a number of ways. One method is to vary the percent weight composition of silica in the epoxy base material. The composition of regions 40A and 40B can also be controlled by varying the temperature and amount of premixing of the filler before it is dispensed into the gap between semiconductor device 42 and substrate 44. The curing temperature and time may also be adjusted to obtain a desired composition. The epoxy compositions used in the present invention may also include suitable hardening agents, catalysts, dyes, etc. as are well known in the art.

Additional curing steps may be performed after the formation of regions 40A and 40B. For example, in one embodiment, semiconductor device 42, substrate 44 and interconnection structure 40 are cured at a temperature of approximately 150° C. for about 5 hours after the precuring process is complete.

Figure 3:
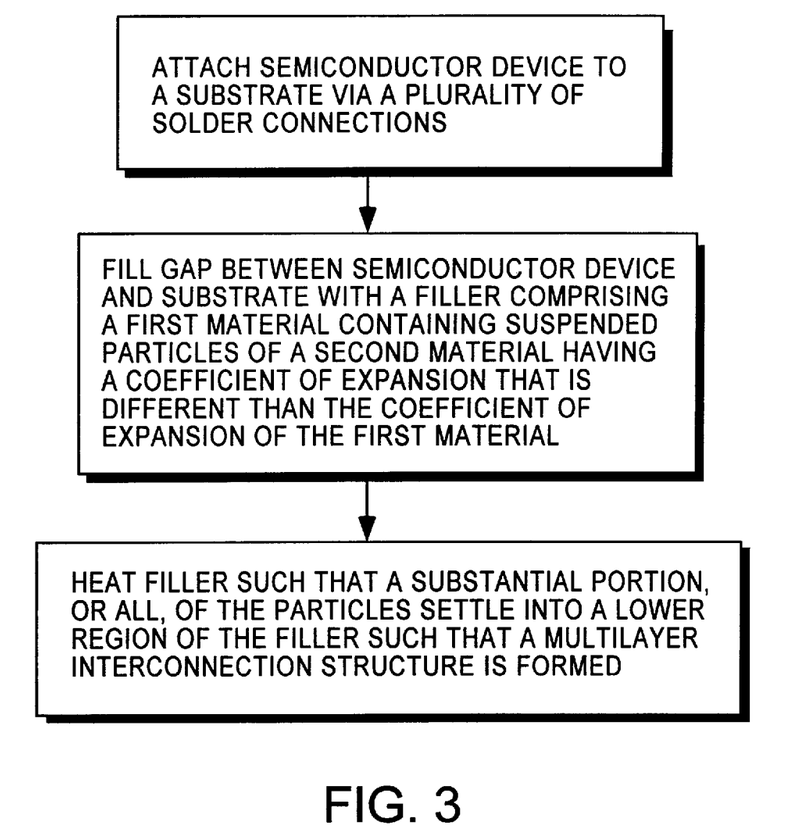
FIG. 3 illustrates a flow chart of one embodiment of the present invention.

FIG. 3 illustrates a flow chart for forming an interconnection structure in one embodiment of the present invention.

Although an interconnection structure comprising an epoxy containing silica particles has been described, it is important to note that any of a number of other additives may be used in lieu of silica. For example, organic particles similar to those used to manufacture substrates may be used. These may include polymer impregnated fiberglass particles. Further, it is contemplated that filler materials other than epoxy based materials may be used to form the interconnection structure. Moreover, it is important to note that the present invention is not limited to a two region interconnection structure. The implementation of the present invention only requires the formation of a multiregion solder interconnection structure wherein adjoining regions possess different coefficients of thermal expansion.

It is appreciated that the methods and apparatus of the present invention may be used in other technologies to form electrical and/or mechanical connections between other types of electronic devices. It is further understood that the relative dimensions, geometric shapes, materials and process parameters set forth within the specification are exemplary of the disclosed embodiments only. Other embodiments may utilize different dimensions, shapes, materials, and process settings, etc., to achieve substantially the same results.

What is claimed is:

1. An interconnection structure in a gap between an electrical device and a substrate, said interconnection structure comprising:

an epoxy based filler divided into a first region and a second region, said filler containing a plurality of particles having the percentage by weight of said particles in said first and second regions being different;

said first and second regions substantially encasing a metal bump electrically connecting a first contact pad on said electrical device and a second contact pad on said substrate.

2. The structure of claim 1 wherein said first region is disposed between said substrate and said second region, and said second region is disposed between said electrical device and said first region.

3. The structure of claim 2 wherein the coefficient of thermal expansion of said second region is greater than the coefficient of thermal expansion of said first region.

4. The structure of claim 1 wherein said particles comprise silica particles.

5. The structure of claim 1 wherein said particles comprise polymer impregnated fiberglass particles.

6. The structure of claim 2 wherein said particles in said first region comprise silica particles wherein the amount of silica in said first region is about 50 to 60 percent by weight.

7. The structure of claim 6 wherein said particles in said second region comprise silica particles wherein the amount of silica in said second region is approximately 5 to 10 percent by weight.

8. A structure for coupling a first and a second substrate, said structure comprising:

a first contact pad on said first substrate coupled by a metal bump to a second contact pad on said second substrate; and an epoxy based filler divided into a first region and a second region, said filler containing a plurality of particles having a different coefficient of thermal expansion than said filler, the percentage by weight of said particles in said first and second regions being different, said first region being disposed between said first substrate and said second region and covering the exposed surface areas of said first contact pad and a first half of said metal bump, said second region being disposed between said second substrate and said first region and covering the exposed surface areas of said second contact pad and a second half of said metal bump.

9. The structure of claim 8 wherein the coefficient of thermal expansion of said second region is greater than the coefficient of thermal expansion of said first region.

10. The structure of claim 8 wherein said particles comprise silica particles.

11. The structure of claim 8 wherein said particles comprise polymer impregnated fiberglass particles.

12. The structure of claim 8 wherein said particles in said first region comprise silica particles wherein the amount of silica in said first region is about 50 to 60 percent by weight.

13. The structure of claim 12 wherein said particles in said second region comprise silica particles wherein the amount of silica in said second region is about 5 to 10 percent by weight.

14. An interconnection structure in a gap between a first substrate having a first coefficient of thermal expansion and a second substrate having a second coefficient of thermal expansion, said structure comprising:

a filler comprising a first region having a third coefficient of thermal expansion and a second region having a fourth coefficient of thermal expansion, said first region being disposed between said first substrate and said second region, said second region being disposed between said second substrate and said first region, said third coefficient being closer to said second coefficient than said first coefficient, said fourth coefficient being closer to said first coefficient than said second coefficient;

said first and second regions substantially encasing a metal bump coupling a first contact pad on said first substrate to a second contact pad on said second substrate.

* * * * *